United States Patent
Kaltenbrunner et al.

[11] Patent Number: 5,861,609
[45] Date of Patent: *Jan. 19, 1999

[54] METHOD AND APPARATUS FOR RAPID THERMAL PROCESSING

[76] Inventors: Guenter Kaltenbrunner, Heideweg 7, Baldham, Germany, 85551; Thomas Knarr, Finkenstr. 1, Langenau, Germany, 89179; Zsolt Nenyei, F.-Leharstr. 35, Blaustein, Germany, 89134

[*] Notice: This patent issued on a continued prosecution application filed under 37 CFR 1.53(d), and is subject to the twenty year patent term provisions of 35 U.S.C. 154(a)(2).

[21] Appl. No.: 537,409
[22] Filed: Oct. 2, 1995
[51] Int. Cl.[6] .......................... H01L 21/324; H05B 1/00; C23C 16/00
[52] U.S. Cl. .......................... 219/390; 219/405; 118/725; 118/50.1
[58] Field of Search ...................... 219/390, 405, 219/411; 392/416, 418; 118/50.1, 724, 725; 437/247; 250/492.2

[56] References Cited

U.S. PATENT DOCUMENTS

| | | | |
|---|---|---|---|
| 5,011,794 | 4/1991 | Grim et al. | 437/247 |
| 5,318,362 | 6/1994 | Schietinger et al. | 374/142 |
| 5,336,641 | 8/1994 | Fair et al. | 437/248 |
| 5,439,850 | 8/1995 | Ozturk et al. | 437/228 |
| 5,446,824 | 8/1995 | Moslehi | 392/416 |
| 5,551,985 | 9/1996 | Brors et al. | 118/725 |
| 5,576,059 | 11/1996 | Beinglass et al. | 118/725 |

FOREIGN PATENT DOCUMENTS

| | | |
|---|---|---|
| 4306398 | 9/1994 | Germany . |
| 60-211947 | 10/1985 | Japan . |
| 61-129834 A | 10/1985 | Japan . |
| 60-212947A | 6/1986 | Japan . |
| 01-110726 | 4/1989 | Japan . |

*Primary Examiner*—Teresa J. Walberg
*Assistant Examiner*—J. Pelham
*Attorney, Agent, or Firm*—Rodney T Hodgson

[57] ABSTRACT

A thin visible and near IR absorbing plate is placed between the radiation source and the object to be processed in a rapid thermal processing system. The object is heated in part by the near IR and far IR radiation from the thin plate, and the material and optically induced heating inhomogeneities are reduced.

13 Claims, 2 Drawing Sheets

METHOD AND APPARATUS FOR RAPID THERMAL PROCESSING

BACKGROUND OF THE INVENTION

1. Field of the Invention

The present invention relates to an apparatus and a method for the rapid thermal processing (RTP) of sensitive electronic materials. The present invention reduces the thermal inhomogeneities introduced when the materials have inhomogeneous structure and optical absorption characteristics.

2. Description of the Prior Art

Rapid Thermal Processing (RTP) is a versatile optical heating method which can be used for semiconductor processing as well as a general, well controlled, method for heating objects or wafers which are in the form of thin sheets, slabs, or disks. The objects are inserted into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infra-red radiation may be used. The radiation from the lamps is directed through the transparent portions of the walls on to the surface of the object to be heated. As long as the objects absorb light in the near infrared or visible spectral region transmitted by the transparent portion of the walls, RTP techniques allow fast changes in the temperature and process gas for the different material processes and conditions. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate, and produce temperature uniformities across the plate adequate for semiconductor processing processes. However, when the material is not uniform and has, for example, non-uniform optical or material characteristics, relatively large temperature non-uniformities can occur. This is particularly injurious for a partially processed silicon wafer with various parts of devices implanted, etched, or grown on the wafer.

The temperature control in current RTP systems is mostly performed by monochromatic (or narrow wavelength band) pyrometry measuring temperature of the relatively unstructured and featureless backside of semiconductor wafers. The results of the temperature measurement are used in a feedback control to control the heating lamp power. Backside coated wafers with varying emissivity can not be used in this way, however, and the backside layers were normally etched away or the temperature was measured using contact thermocouples.

A newer method of temperature control is the power controlled open loop heating described in our U.S. Pat. No. 5,359,693, which patent is hereby incorporated by reference. This patent also discloses a method of producing relatively defect free material in RTP machines. The number integrated circuits using sub-half-micron technology has increased enormously since we filed for our patent, and the methods outlined are not sufficient to produce the necessary material quality. The structure dependent thermal and process inhomogeneities must be reduced to the absolute minimum physically possible.

Apparatus induced thermal inhomogeneities have been reduced in the last few years because of the demand for more uniform processing. Among the techniques used have been control of the individual lamp power, use of circular lamps, and rotation of the semiconductor wafers with independent power control.

The reduction of temperature non-uniformities due to non uniformities and structures on the material being processed, however, presents many more problems. Thin films on the surface of the heated structure can have constructive or destructive interference effects, and lead to large differences in power density absorbed, even though the incident radiation is absolutely uniform. Geometrical or chemical structures can also lead to non uniform energy absorption. For example, differing dopant levels lead to different absorption coefficients for particular wavelengths of the incident light.

These effects have been described in "Rapid Thermal Annealing—Theory and Practice", by C. Hill, S. Jones, and D Boys, NATO Summer school: Reduced Thermal Processing for ULSI, Boca Raton, Fla., 20 Jun. to 1 Jul. 1988. Other references include "Impact of Patterned Layers on Temperature Non-Uniformity During Rapid Thermal Processing for VLSI- Applications", P. Vandenabeele, K Maex, R. De Keersamaekker, 1989 Spring Meeting of the Materials Research Society, San Diego, Symposium B., Apr. 25–28, 1989; "Temperature Problems with Rapid Thermal Processing for VLSI- Applications", Dr. R. Kakoschke, Nuclear Instruments and Methods in Physics Research, B 37/38 (1989) pp. 753–759; and in Defect-Guarded Rapid Thermal Processing", Z. Nenyei, H. Walk, T. Knarr, J. Electrochem. Soc., pp. 1728–1733 140, No. 6, Jun. (1993).

Patents such as U.S. Pat. No. 4,891,499, hereby incorporated by reference, and EP 0 290 692 A1 give suggestions for making the uniformity better over the whole wafer, but do not deal with the structure induced inhomogeneities. The challenge is still the continuous improvement of the wafer to wafer temperature control for the better repeatability and the continuous improvement of the process homogeneity on the patterned frontsides of the wafers.

Japanese patent application 61-129,834 proposes quartz plates interposed between the quartz walls of the RTP chamber and the wafer. The plates transmit the short wavelength radiation from the lamps and absorb the (non-uniform) longer wavelength radiation from the hot walls of the chamber.

Japanese patent document JP A 60-211947 discloses an RTP system with an optical system arranged to keep all lamp light out of the pyrometer measuring system by absorbing it in a graphite plate.

Kanack et. al. , Appl. Phys. Lett. 55 2325 (1989) disclose a method of annealing contacts in GaInAsP by placing the InP substrate wafer between two silicon susceptor wafers.

The presence and reduction of structure induced inhomogeneities appears to be more complicated than has been presented in the literature. In fact, the reduction of structure induced inhomogeneities in RTP systems has physical limits.

In order to achieve rapid heating and high substrate temperatures, the color temperature of the lamps used in the RTP system must be much higher than the desired wafer temperature. In addition, the emitting surface area of the tungsten lamp filaments much smaller than the surface of the reflectors which distribute the light through multiple reflections in an RTP system, which requires even higher color temperature of the filaments of the lamp. A high color temperature has the disadvantage that the lamp emission spectrum is quite different from the emission spectrum radiated from the wafer. If the lamp and wafer emission spectra were the same, for example, varying absorption coefficients on the wafer would imply the same varying emission coefficients, so that if more light energy were absorbed in one place, more light energy would be radiated and the temperature would be substantially constant independent of the varying absorption constants. When the peaks of the incident energy spectra from the lamps and the radiant energy spectra from the wafer are far apart, the varying absorption constants are not balanced by identically varying emission coefficients.

In addition, identical thin film structures with different lateral dimensions will have different temperature time profiles since the thermal capacity of the neighborhood of the structure will have a larger effect for smaller area structures.

However, these "passive" structure determined inhomogeneities which are known in the literature have been neglected for small structures.

Chemical solid state reactions such as silicidization or oxidation and physical structure changes such as annealing of amorphous implanted silicon to crystal silicon are mostly exothermic processes. Some allotropic processes are, however, endothermic. These sources and sinks of energy are highly localized, and can lead to temperature inhomogeneities. We have, however, found nothing in the RTP literature that deals with such effects.

In conventional thermal processing, where the conductive or convective energy transfer is dominant and the heating rates of 1–10 C / minute are common, such structure induced temperature inhomogeneities are not important, because there is enough time for thermal conduction to "even out" such inhomogeneities. At heating rates of 10–1000 C/sec, however, such inhomogeneities can be important. In the usual RTP reactor, the wafer is heated at from 10–100 C/sec. When the desired temperature is reached, the temperature is usually held constant (steady state temperature) for a determined time. Multi step temperature time profiles can also be programmed into a modem system. Very great care is taken to test the wafer temperature homogeneity during this entire heating process, generally using unstructured wafers. Less care is taken to measure or take into account the structure generated inhomogeneities, and less effort is generally given to reducing them.

The "thermal reactions" often have their greatest reaction rate at the beginning of the "steady state" temperature period, and are usually finished in the next 10–100 seconds. Titanium and Cobalt silicide processes are a good example of such processes. Local temperature differences can be amplified under such conditions due to the rapid change of the optical properties of the new phase. In this case, such solid state reactions can proceed a different rates for different areas of material, and possibly for the smallest structures the reactions will not proceed to the desired point.

Most RTP machines have a thin rectangular quartz reaction chamber having one end open as sketched in FIG. 1. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

Reactors based on this principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. Copending patent application Ser. No. 08/387,220, hereby incorporated by reference, teaches the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer.

OBJECTS OF THE INVENTION

It is an object of the invention to provide a rapid thermal processing (RTP) system which reduces the structurally induced temperature inhomogeneities inherent in a conventional RTP system.

It is an object of the invention to provide a method of heating an object in a RTP system so that temperature inhomogeneities due to differences in material or absorption coefficient or emission coefficient are reduced.

It is an object of the invention to provide a rapid thermal processing system which is capable of rapid turnaround and high throughput of objects to be processed with good repeatability even in the case where backside emissivity varies.

SUMMARY OF THE INVENTION

The reaction chamber of a rapid thermal processing system contains a thin opaque, plate spaced apart from the object to be heated, and placed between the object to be heated and the heating lamps. The thin plate has at least the area of the object to be heated. The thin plate absorbs the radiation energy from the lamps, and reradiates energy to the object. The spectrum of the radiation from the thin plate is different from the spectrum of the light from the lamps. The thin plate thus acts as a "light transformer" to change the spectrum of the heating radiation so that it is closer to the thermal emission spectrum of the object to be heated. The thin plate also heats the object by conduction and by convection through the atmosphere in the chamber. The thin plate may also have an anti-reflective coating at the wavelength measured by a pyrometer measuring the temperature of the thin plate in order to reduce the radiation from the heating lamp scattered into the pyrometer.

DETAILED DESCRIPTION OF THE INVENTION

Figure 1:
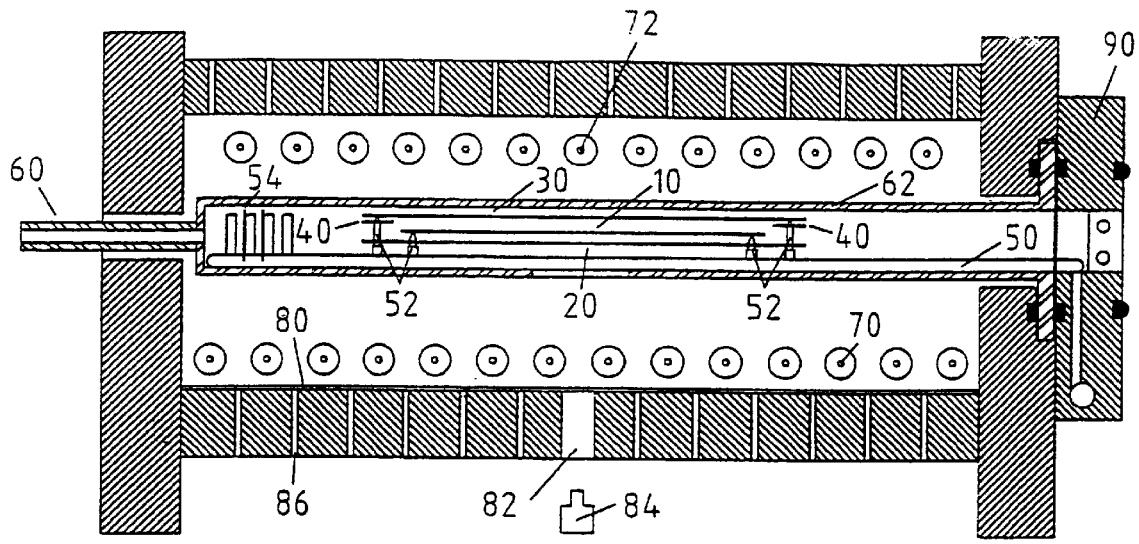
FIG. 1 is a sketch of the prior art conventional open ended quartz reactor chamber RTP system with two banks of heating lamps with the thin radiation absorbing plates of the present invention interposed between the lamps and the wafer to be heated.

FIG. 1 shows a wafer 10 held in an RTP apparatus between the thin absorbing plates 20 and 30 of the invention. A guard ring 40 is shown. The wafer 10, the bottom thin absorbing plate 20, the top absorbing plate 30, and the guard ring 40 are all supported by quartz pins 52 resting on a quartz carrier frame 50. The gas inlet 60 to the quartz chamber 62 releases gas which is baffled by baffle plates 54. Heating lamps 70 supply the radiation for heating the bottom plate 20 and heating lamps 72 heat the top plate 30. The radiation, convection, and convection from the bottom plate 20 and the top plate 30 heat the wafer 10. A pyrometer 84 measures the temperature of the bottom plate 20 through a pyrometer view port 82 in the reflecting wall 80 surrounding the heating lamps 70. The reflecting walls 80 have air cooling channels 86. A door 90 seals the quartz chamber 62.

The top thin plate 30 and the bottom thin plate 20 of the invention should be in a spaced apart and not touching relationship to the wafer 10. The preferred distance is from 1 to 20 mm. The more preferred distance is from 3–8 mm, and the most preferred distance is from 5–7 mm. The closer the plates 20 and 30 are to the wafer 10, the faster the wafer 10 temperature follows the temperature of the plates 20 and 30. The closer the plates are, the narrower the RTP chamber can be, and the faster the wafers can be turned around and the chamber flushed between RTP processing of each wafer. If the wafer is in contact with the plates 20 or 30, damage and contamination may result, as well as non uniform heating from the few points where the wafer and plate touch. With an atmosphere of gas in the reaction chamber, conduction and convection of heat plays a larger part in the heat transfer if the plates are closer to the wafer.

With only one bank of lamps, only one plate is necessary to act as a "light transformer". If one side of the wafer is homogeneous, the other side could use a single light transformer plate to good advantage in a top and bottom lamp array setup. In the case pattern related inhomogeneities on the top side of the wafer, the top thin plate 30 is used.

Figure 2:
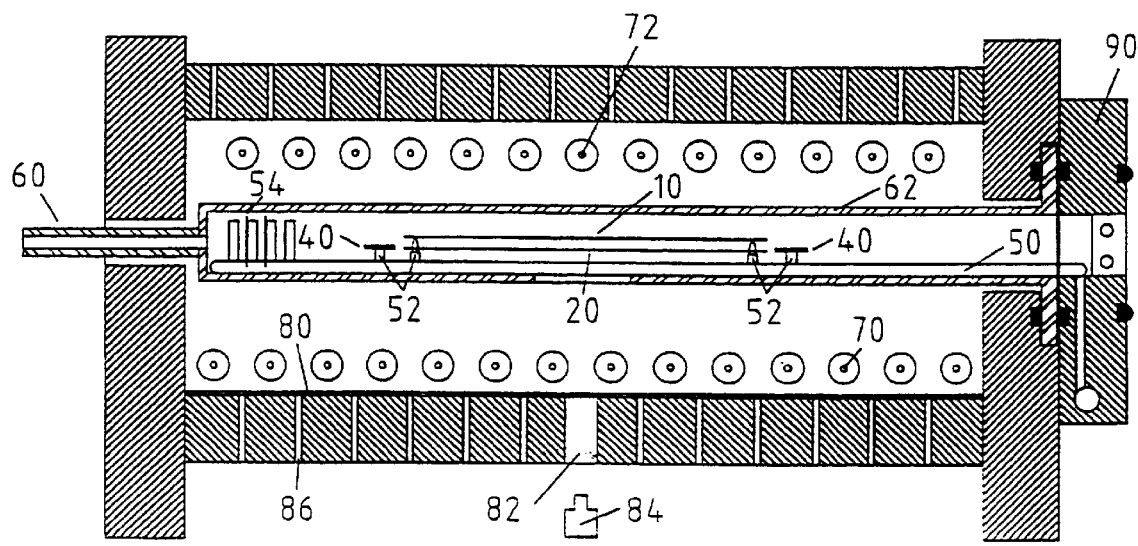
FIG. 2 is a sketch the embodiment in the case when only a single thin radiation absorbing plate is used.
Figure 3:
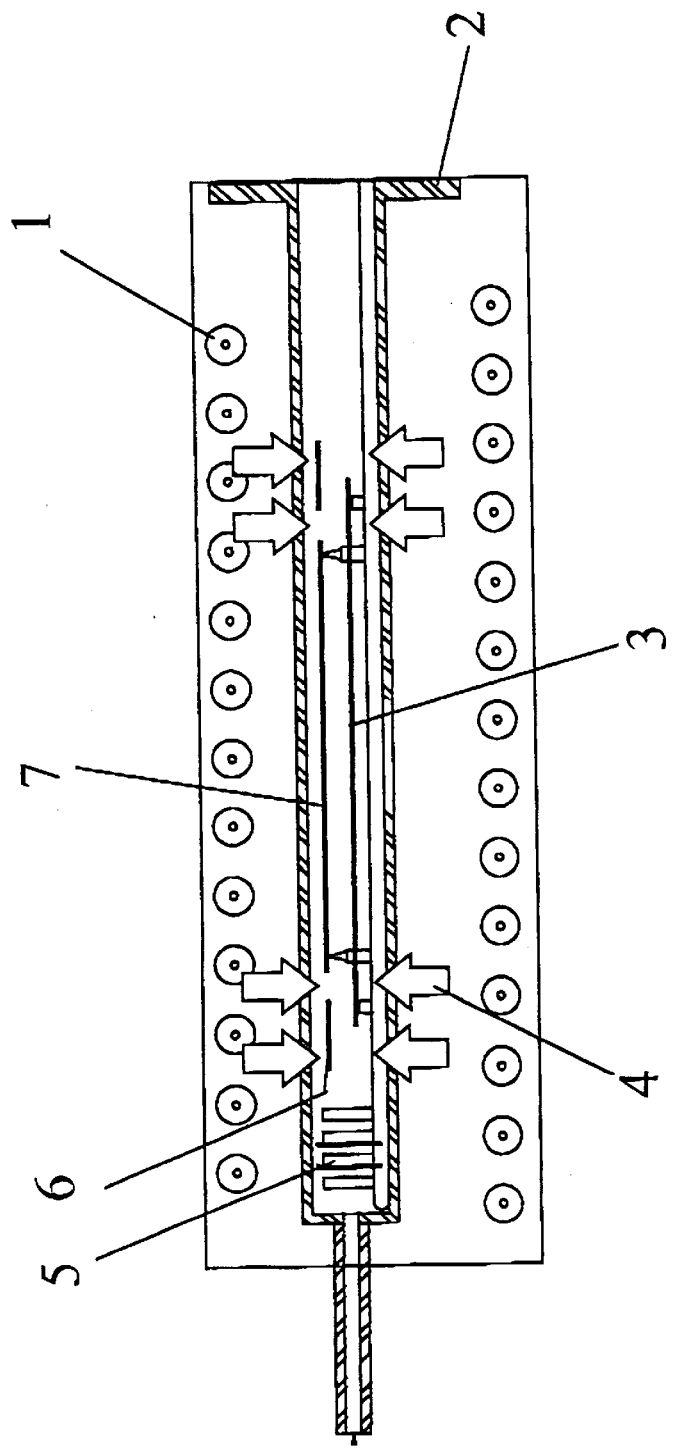
FIG. 3 is a sketch of the temperature vs time for a production wafer.

In the most preferred embodiment, where backside emissivity variation affects the temperature feedback and control of the wafer, the single bottom thin plate 20 is used as in FIG. 2, and the temperature of the bottom thin plate 20 is fed back to control the power to the heating lamps. In the most preferred embodiment, additional heat is supplied to the wafer by the top lamp array to increase the throughput of the apparatus.

The thin light absorbing plates 20 and 30 can be made of any material which absorbs and is heated by the visible and/or near infra-red radiation from the heating lamps. Materials such as heavily doped silicon, silicon carbide, boron nitride, aluminum nitride, graphite, silicon carbide coated graphite, diamond coated graphite, or other such materials are suitable. The invention is not limited to the choice of materials, as long as the plates 20 and 30 absorb substantially all the visible and/or near IR radiation from the heating lamps which is transmitted through the transparent portion of the chamber wall. The longer wavelength radiation from the lamps is absorbed in the quartz walls 62 of the reaction chamber and does not reach the plates 20 and 30. It is important that substantially no material is interposed between the plates 20 and 30 and the wafer, as the plates emit substantial amounts of infra-red radiation with wavelength longer than 3 to 4 microns that is absorbed by most materials.

The thin light absorbing plates 20 and 30 must have at least the same or larger area than the object to be heated, in the preferred embodiment a semiconductor wafer 10. It is preferred that a guard ring 40 be used to ensure temperature uniformity across the wafer 10. It is important that the thermal capacity of the combination of the two plates 20 and 30, the wafer 10, and the guard ring 40 be approximately constant per unit area to ensure uniform heating of the wafer 10. In the preferred embodiment, the guard ring 40 has an inside diameter 1–5 mm larger than the outside diameter of the wafer, and the thickness of the guard ring 40 is greater than the thickness of the wafer. In the most preferred embodiment the guard ring 40 has an inside diameter 2–4 mm greater than the diameter of the wafer 10. In the most preferred embodiment, if only one thin light absorbing plate 20 is used, the guard ring 40 has a thickness twice the thickness of the silicon wafer 10, so that the heat capacity of the plate 20 , the wafer 10, and the guard ring 40 is approximately constant per unit area. The guard ring 40 is placed slightly lower than the wafer 10 to allow the wafer handling apparatus to bring the wafer in, lower the wafer 10 to the pins 52, and withdraw. In the most preferred embodiment, the bottom thin light absorbing plate 20 is placed at the level of the guard ring 40.

The visible and infrared radiation from the lamps is absorbed in the thin plates 20 and/or 30 and the color temperature of the radiation heating the wafer is thus lowered markedly. The uniformity of the radiation incident on the wafer 10 is also markedly improved if the temperature of plates 20 and 30 is uniform. The structure induced inhomogeneities are markedly reduced by the reduction of the color temperature to a temperature nearer the color temperature of the wafer.

In the set up sketched in FIGS. 1 and 2, the advantages of the lesser volume of the quartz chamber, which is important for fast control of the flushing gas atmosphere, and the advantages of the "warm wall" reactor over the "hot wall" reactor, are kept with the addition of the thin radiation absorbing plates 20 and/or 30.

Use of the "light transformer" plate under the wafer 10 solves a temperature control problem when back side pyrometry is used to measure and control the wafer temperature where a backside film on the wafer may change the emissivity of the wafer and interfere with the temperature measurement and control. The "light transformer plates" presumably will have constant emissivity and reflectivity from wafer to wafer, and the temperature of the wafer can be inferred from the measured temperature of plate 20. Use of a pyrometer which measures a narrow band width of wavelengths is also made easier, because the light absorbing plates may reflect less scattered lamp light to the pyrometer than a surface of silicon. A bare silicon surface reflects 32% of the visible light incident on the surface. This reflection may markedly vary as the silicon has various thin film coatings, and may markedly vary as the thickness of the coating varies. The reflectivity for visible light of the thin light absorbing plates 20 and 30 should be preferably less than 32%, more preferably less than 25%, and most preferably less than 10%.

It is a further embodiment of the invention to control the reflectivity and emissivity of the light absorbing plates by coating them on one or both sides with one or more layers of a thin film interference film. A single thin film thickness is conveniently set so that the reflectivity of the light absorbing plates has a minimum of less than 3% at the wavelength which the pyrometer measures. A multilayer film is used for a pyrometer or a pyrometer plus filter combination which measures a very narrow bandwidth of infra-red radiation, so that the reflection coefficient is less than 1% at the wavelength which the pyrometer measures. In this manner, the light reflected from the light absorbing plates gives less background in the pyrometer measurement.

The absorption coefficient for radiation should most preferably high enough that the light absorbing plates 20 and 30 transmit less than 5% of the visible and/or the near IR lamp light incident on to their surfaces. The plates 20 and 30 are most preferably opaque to visible and/or to near infra-red light from the heating lamps.

It is an additional embodiment of the invention to increase throughput by holding the temperature of the plates 20 and/or 30 at an elevated temperature while the already processed wafer is removed and a new wafer to be processed is introduced. The lamps are run at lower power to keep the temperature of the plates 20 and/or 30 at a minimum temperature while the wafer is being changed.

We claim:

1. A rapid thermal processing (RTP) chamber for rapid thermal processing of a semiconductor wafer in the chamber, the chamber having at least a first wall, the first wall having a transparent area for transmitting visible and near infra-red (IR) radiation from a radiation source, the energy of the transmitted visible and near IR radiation used for heating the semiconductor wafer, comprising;

a thin visible and near IR radiation absorbing plate spaced apart from the semiconductor wafer to be processed by a distance from 1–20 mm placed between the semiconductor wafer to be processed and the radiation source, the thin visible and near IR radiation absorbing plate having substantially the same diameter as the semiconductor wafer; and a guard ring with inside diameter slightly greater than the diameter of the semiconductor wafer, the thickness of the guard ring being chosen that the thermal capacity per unit area of the combination of the guard ring, the semiconductor wafer, and the thin visible and near IR radiation absorbing plate is substantially constant.

2. The RTP chamber of claim 1, wherein the thin plate is spaced apart from the semiconductor wafer to be heated by a distance from 3 mm to 8 mm.

3. The RTP chamber of claim 1, wherein the thin plate transmits less than 5% of the visible and near IR radiation from the radiation source.

4. The RTP chamber of claim 1, wherein the thin plate transmits less than 5% of the near infra-red radiation from the radiation source.

5. The RTP chamber of claim 2, wherein the thin plate is opaque to visible and near IR radiation from the radiation source.

6. The RTP chamber of claim 1, wherein the thin visible and near IR absorbing plate has an antireflective coating to minimize reflectivity at a wavelength measured by a temperature measuring system.

7. A method of rapid thermal processing (RTP) of a semiconductor wafer in an RTP system, the RTP system comprising a source of visible and near IR radiation, a chamber, the chamber having at least one wall with a radiation transparent area, comprising the steps of;

a) placing the semiconductor wafer to be processed in the chamber in a spaced apart relationship to a thin visible and near IR radiation absorbing plate the thin visible and near IR radiation absorbing plate being substantially the same diameter as the semiconductor wafer, wherein a guard ring with inner diameter slightly larger than the semiconductor wafer and the thin visible and near IR radiation absorbing plate surrounds the semiconductor wafer and the plate, where the guard ring has a thickness chosen so that the thermal capacity per unit area of the combination of the guard ring, the semiconductor wafer, and the thin visible and near IR radiation absorbing plate is substantially constant;

b) heating the thin plate with radiation from the source of visible and near IR radiation, thereby heating the semiconductor wafer to be processed by radiation and by convection of heat from the thin visible and near IR radiation absorbing plate.

8. The method of claim 7, further comprising;

c) withdrawing the processed semiconductor wafer from the chamber; then d) heating the thin plate with radiation from the source of visible and near IR radiation, then e) placing a second semiconductor wafer to be processed in the RTP chamber in a spaced apart relationship to the thin plate; then f) heating the thin plate with radiation from the source of visible and near IR radiation, thereby heating the second semiconductor wafer to be processed and increasing the throughput of the RTP processing system.

9. A method of rapid thermal processing (RTP) of a semiconductor wafer in an RTP system, comprising the steps of;

a) placing a thin visible and near IR radiation absorbing plate between a radiation source and the semiconductor wafer to be processed in an RTP system, the thin visible light absorbing plate being placed in a spaced apart relation 1 to 20 mm from the semiconductor wafer to be processed, the thin visible and near IR radiation absorbing plate being substantially the same diameter as the semiconductor wafer, wherein a guard ring with inner diameter slightly larger than the semiconductor wafer and the thin visible and near IR radiation absorbing plate surrounds the semiconductor wafer and the plate, where the guard ring has a thickness chosen so that the thermal capacity per unit area of the combination of the guard ring, the semiconductor wafer, and the thin visible and near IR radiation absorbing plate is substantially constant; and b) heating the thin visible and near IR radiation absorbing plate with radiation from the radiation source, whereby the semiconductor wafer to be processed is heated in part by near IR and far IR radiation from the thin plate.

10. The method of claim 9, further comprising:

c) measuring the temperature of the thin visible and near IR radiation absorbing plate; and d) controlling the power of the radiation source according to the temperature of the thin visible and near IR radiation absorbing plate.

11. The method of claim 10, further comprising;

e) heating the semiconductor wafer to be processed with a second radiation source, the second radiation source being located on the opposite side of the semiconductor wafer to be processed than the thin visible and near IR radiation absorbing plate.

12. The method of claim 10, wherein the temperature of the thin visible and near IR radiation absorbing plate is measured by a pyrometer, and wherein the thin visible and near IR radiation absorbing plate has an antireflective coating to minimize reflectivity at a wavelength measured by the pyrometer.

13. A method of rapid thermal processing (RTP) of a semiconductor wafer in an RTP system, the RTP system comprising a source of visible and near IR radiation, a chamber, the chamber having at least one wall with a radiation transparent area, comprising the steps of;

a) placing the semiconductor wafer to be processed in the chamber in a spaced apart relationship to a thin visible and near IR radiation absorbing plate, the thin visible and near IR radiation absorbing plate having substantially the same diameter as the semiconductor wafer;

b) heating the thin plate with radiation from the source of visible and near IR radiation to a first temperature, thereby heating the semiconductor wafer to be processed by radiation and by convection of heat from the thin visible and near IR radiation absorbing plate; then c) withdrawing the processed semiconductor wafer from the chamber; then d) heating the thin plate with radiation from the source of visible and near IR radiation to a second temperature, the second temperature substantially less than the first temperature, then e) placing a second semiconductor wafer to be processed in the RTP chamber in a spaced apart relationship to the thin plate; then f) heating the thin plate with radiation from the source of visible and near IR radiation, thereby heating the second semiconductor wafer to be processed and increasing the throughput of the RTP processing system.

* * * * *